United States Patent
Oda et al.

(10) Patent No.: US 6,872,642 B2
(45) Date of Patent: Mar. 29, 2005

(54) MANUFACTURING METHOD OF SEMICONDUCTOR DEVICE

(75) Inventors: Hidekazu Oda, Tokyo (JP); Hirokazu Sayama, Tokyo (JP); Kazunobu Ohta, Tokyo (JP); Kouhei Sugihara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/442,226

(22) Filed: May 21, 2003

(65) Prior Publication Data

US 2004/0101999 A1 May 27, 2004

(30) Foreign Application Priority Data

Nov. 22, 2002 (JP) ........................................ 2002-339320

(51) Int. Cl.[7] .......................................... H01L 21/425
(52) U.S. Cl. .................... 438/528; 438/592; 438/655
(58) Field of Search ............................. 438/407, 528, 438/592, 655, 664

(56) References Cited

U.S. PATENT DOCUMENTS 6,159,856 A * 12/2000 Nagano ...................... 438/683
6,255,214 B1 * 7/2001 Wieczorek et al. ......... 438/664
6,555,880 B2 * 4/2003 Cabral et al. ................ 257/384

FOREIGN PATENT DOCUMENTS

| JP | 11-16855 | 1/1999 |
| JP | 11-111980 | 4/1999 |
| JP | 2001-36092 | 2/2001 |
| JP | 2001-53027 | 2/2001 |

* cited by examiner

*Primary Examiner*—Chandra Chaudhari
(74) *Attorney, Agent, or Firm*—Oblon, Spivak, McClelland, Maier & Neustadt, P.C.

(57) ABSTRACT

A method of manufacturing a semiconductor device is provided which can suppress leakage current increases by making into silicide. Impurity that suppresses silicide formation reaction (suppression impurity), such as germanium, is introduced into source/drain regions (16, 36) from their upper surfaces. In the source/drain regions (16, 36), a region shallower than a region where the suppression impurity is distributed (50) is made into silicide, so that a silicide film (51) is formed in the source/drain regions (16, 36). Thus, by making the region shallower than the region (50) into silicide, it is possible to suppress that silicide formation reaction extends to the underside of the region to be made into silicide. This enables to reduce the junction leakage between the source/drain regions (16, 36) and a well region.

14 Claims, 12 Drawing Sheets

MANUFACTURING METHOD OF SEMICONDUCTOR DEVICE

BACKGROUND OF THE INVENTION

1. Field of the Invention

The present invention relates to a method of manufacturing a semiconductor device having a silicide film.

2. Description of the Background Art

In recent years, high integration of semiconductor devices has been improved and a large number of elements are mounted in a single chip. Most of these elements are MOS transistors that can be classified into an nMOS transistor through which electrons pass (i.e., the negative MOS transistor) and a pMOS transistor through which holes pass (i.e., the positive MOS transistor). In a semiconductor device, such transistors having different poralities are combined to configure a circuit.

In a conventional MOS transistor, to lower the resistances of a source/drain region and gate electrode, a silicide film is formed thereon. The silicide film is generally formed by directly making the source/drain region and gate electrode into silicide. When making the gate electrode into silicide, a gate insulating film is formed therebelow and thus it is avoided that silicide formation reaction extends through the gate insulating film to a semiconductor substrate. On the other hand, when making the source/drain region into silicide, silicide formation reaction extends in the direction of the depth of the semiconductor substrate. It is therefore necessary to prevent an increase in junction leakage by setting the depth of the source/drain region so as be sufficiently large. This is one obstacle to the miniaturization of semiconductor devices.

To overcome the above problem, in Japanese Patent Application Laid-Open No. 11-11980 (hereinafter, referred to as "patent documents 1"), a technique of miniaturizing a semiconductor device is suggested. That is, a suppression atom for suppressing silicide formation reaction (hereinafter referred to simply as a "suppression atom") is introduced into a source/drain region such that a silicide film of the source/drain region is thinner than a silicide film of a gate electrode.

In this technique, fluorine atom, nitrogen atom, or oxygen atom is used as a suppression atom, and the atom is introduced into the vicinity of the surface of the source/drain region, thereby suppressing silicide formation reaction in the source/drain region.

Meanwhile, in Japanese Patent Application Laid-Open No. 2001-53027, such a technique is suggested, in which with the aim of lowering the resistance of a source/drain region, a silicon germanium (SiGe) layer is formed on the source/drain region and the silicon germanium layer is made into silicide.

In the conventional technique suggested in the patent documents 1, the suppression atom is introduced into the vicinity of the surface of the source/drain region, and then the entire region where the suppression atom has been introduced is made into silicide (see FIGS. 1 and 8 in the patent documents 1). Therefore, silicide formation reaction extends locally in the direction of the depth of the semiconductor substrate, and silicide is formed up to the vicinity of a junction. As the result, junction leakage increases in some cases. Following is a concrete description of this problem.

For example, by anneal at about 500° C., cobalt (Co) that is refractory metal and often used for silicide formation reaction becomes a silicon metal compound in which CoSi and $Co_2Si$ are mixed. Cobalt monosilicide in which a cobalt atom is combined with one silicon atom, such as CoSi and $Co_2Si$, is high in resistance. Therefore, a further anneal at a temperature of not less than 700° C. is normally performed to subject the cobalt monosilicide to a phase transition for obtaining $CoSi_2$ that has a lower resistance.

The reaction process through which the monosilicide such as CoSi or $Co_2Si$ changes to $CoSi_2$ requires more silicon. CoSi and $Co_2Si$ require different numbers of silicon atoms necessary for changing into $CoSi_2$, thus causing a difference in reaction rate. Therefore, the sizes of silicide grains of $CoSi_2$ differ depending on the type of the monosilicide and how the adjacent silicide grows. As the result, when monosilicide is surrounded by grains that grow quickly, the supply of silicon is effected locally only in one direction of the substrate, and silicide formation reaction extends deeply in the semiconductor substrate so that silicide grows up to the vicinity of a junction in some cases.

Although, in the technique described in the patent documents 1, the silicide formation reaction is suppressed by the introduced nitrogen atom etc., the entire region where the suppression atom has been introduced is finally made into silicide. Therefore, no suppression atom is present below the region to be made into silicide. From the reason described above, the silicide formation reaction extends locally to the underside of the region to be made into silicide, which may increase junction leakage.

Recently, as the miniaturization of semiconductor devices is improved, a silicon layer of an SOI (silicon on insulator) substrate is being thinner and the difference between a silicide film and silicon layer is being reduced. Accordingly, when a source/drain region formed in the silicon layer of the SOI substrate is made into silicide, silicide grows greatly toward a channel region underlying a gate electrode at which there is more silicon than the underside of a region to be made into silicide. This may increase the leakage current between source and drain.

Even if the technique in the patent documents 1 is applied to an SOI substrate, the same problem occurs when the source/drain region is made into silicide from its upper surface, because the suppression atom is introduced only to the underside of an exposed surface of the source/drain region.

SUMMARY OF THE INVENTION

It is an object of the present invention to provide a method of manufacturing a semiconductor device enabling high performance of a memory-logic-hybrid semiconductor device.

According to a first aspect of the present invention, a method of manufacturing a semiconductor device includes the following steps (a) to (c). The step (a) is to prepare a semiconductor substrate having in its upper surface a first impurity region of a first conductivity type and a second impurity region of a second conductivity type, the second impurity region being formed on an upper surface of the first impurity region. The step (b) is to introduce impurity suppressing silicide formation reaction into the second impurity region from its upper surface. The step (c) is to make into silicide, after the step (b), a region shallower than a lower limit of a region at which the impurity introduced in the step (b) is distributed.

Since the region shallower than the region where the impurity suppressing silicide formation reaction is distributed is made into silicide, it is possible to suppress the silicide formation reaction from extending to the underside of the region to be made into silicide. As the result, the junction leakage between the first and second impurity regions can be reduced thereby to improve the yield of the semiconductor device.

According to a second aspect of the present invention, a method of manufacturing a semiconductor device includes the following steps (a) to (d). The step (a) is to prepare an SOI substrate having an insulating layer and a semiconductor layer formed on the insulating layer. The step (b) is to form a source/drain region in an upper surface of the semiconductor layer and to form a gate structure having on its side surface a sidewall on the upper surface of the semiconductor layer adjacent to the source/drain region. The step (c) is to introduce, from above the SOI substrate, impurity suppressing silicide formation reaction into the source/drain region. The step (d) is to make, after the step (c), the source/drain region into silicide from its upper surface. The sidewall is also disposed partially on the source/drain region. Further, in the step (c), the impurity is introduced not only below an exposed upper surface of the source/drain region but also below the sidewall.

Since the impurity suppressing silicide formation reaction is also introduced into the source/drain region below the sidewall, even if the semiconductor layer of the SOI substrate is thinned by miniaturization, it is possible to suppress that silicide formation reaction extends to the channel region below the, gate structure when the source/drain region is made into silicide. As the result, the leakage current between the source and drain can be reduced. In addition, a reduction in effective channel length is avoidable and thus a still further miniaturization is possible.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

FIGS. 1 to 9, 12, and 13 are sectional views showing, in the order of the steps, a method of manufacturing a semiconductor device according to a first preferred embodiment of the present invention. This method will be described by referring to these drawings.

Figure 1:
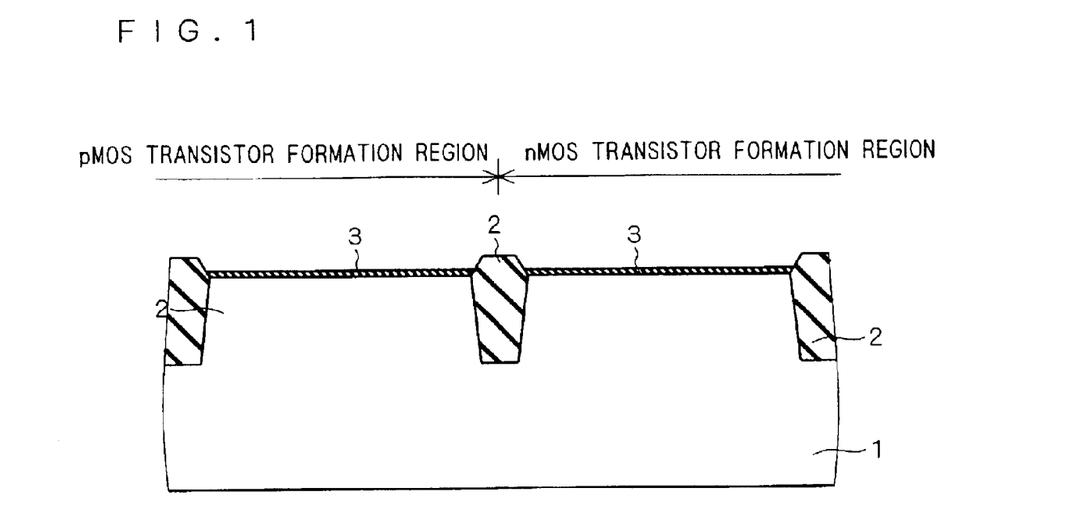
FIGS. 1 to 9 are sectional views showing, in the order of the steps, a method of manufacturing a semiconductor device according to a first preferred embodiment of the present invention.

Referring now to FIG. 1, an element isolation insulating film 2 is formed in an upper surface of a semiconductor substrate 1 that is for example a p-type silicon substrate by a known LOCOS isolation technique or trench isolation technique. Then, a silicon oxide film 3 is formed on the semiconductor substrate 1 that is exposed.

The element isolation insulating film 2 is for example composed of a silicon oxide film, and it divides the semiconductor substrate 1 into a region where a p-channel MOS transistor is formed (hereinafter referred to as a "pMOS transistor formation region") and a region where an n-channel MOS transistor is formed (hereinafter referred to as an "nMOS transistor formation region").

Figure 2:
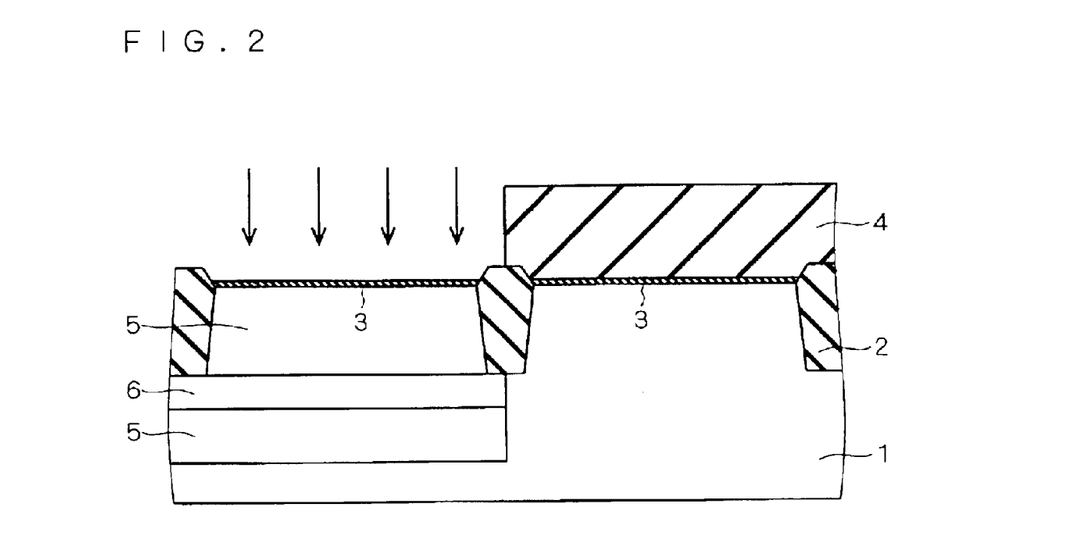

Referring to FIG. 2, a photoresist 4 for opening the pMOS transistor formation region is formed on the silicon oxide film 3 and element isolation insulating film 2. Then, using the photoresist 4 as a mask, an ion implantation of for example arsenic is performed. As the result, an n-type well region 5 is formed in the upper surface of the semiconductor substrate 1 in the pMOS transistor formation region. Then, using again the photoresist 4 as a mask, an n-type element isolation diffusion layer 6 is formed in the n-type well region 5 by an ion implantation of for example arsenic. The photoresist 4 is then removed.

Figure 3:
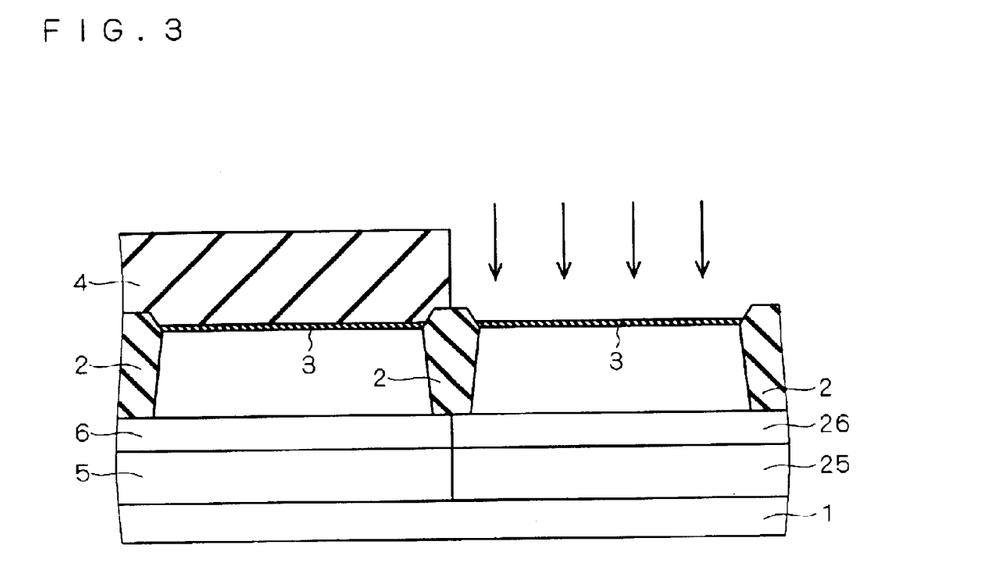

Subsequently, a photoresist 4 for opening the n MOS transistor formation region is formed on the silicon oxide film 3 and element isolation insulating film 2. Then, using the photoresist 4 as a mask, an ion implantation of for example boron is performed. As the result, a p-type well region 25 is formed in the upper surface of the semiconductor substrate 1 in the nMOS transistor formation region. Thereafter, using again the photoresist 4 as a mask, a p-type element isolation diffusion layer 26 is formed in the p-type well region 25 by an ion implantation of for example boron. The photoresist 4 is then removed, and the silicon oxide film 3 is then removed.

Figure 4:
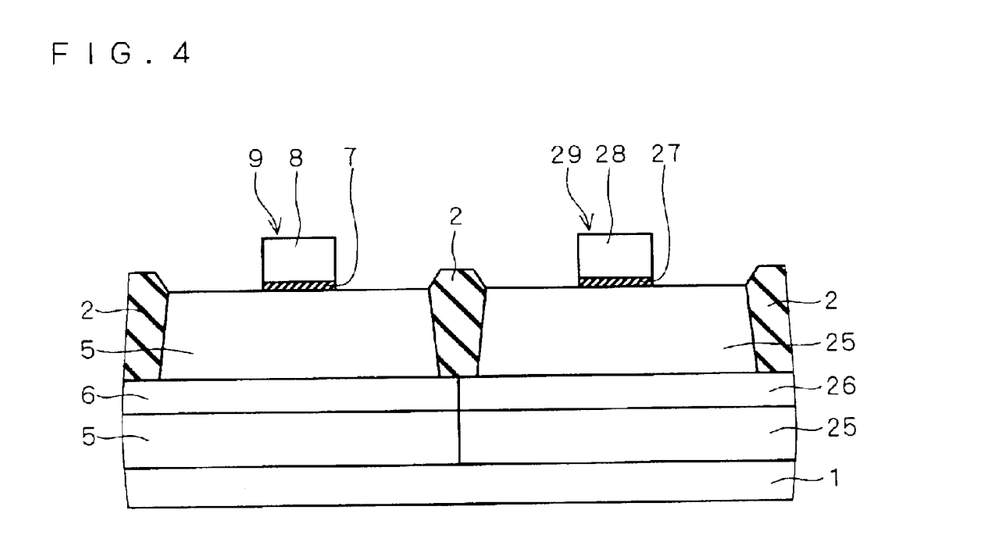

Subsequently, gate structures 9 and 29 are formed on the semiconductor substrate 1 in the pMOS transistor formation region and nMOS transistor formation region, respectively. The gate structure 9 has such a structure that a gate insulating film 7 and gate electrode 8 are laminated in the order named. The gate structure 29 has such a structure that a gate insulating film 27 and gate electrode 28 are laminated in the order named. For example, a silicon oxide film is used as the gate insulating films 7 and 27, and a polycrystalline silicon film is used as the gate electrodes 8 and 28. Following is a concrete description of a method of forming the gate structures 9 and 29.

Firstly, the exposed upper surface of the semiconductor substrate 1 is subjected to wet oxidation, so that a silicon oxide film having a film thickness of for example 3.0 nm is formed on the semiconductor substrate 1 in the pMOS transistor formation region and nMOS transistor formation region. Thereafter, a polycrystalline silicon film having a film thickness of 50 to 250 nm is formed on the silicon oxide film by for example LPCVD (reduced pressure CVD) method.

Subsequently, with photolithography technique, a photoresist (not shown) having a predetermined opening pattern is formed on the polycrystalline silicon film, and the polycrystalline silicon film and silicon oxide film are etched using this photoresist as a mask. The photoresist is then removed. As the result, a gate electrode 8 and gate insulating film 7 are formed in the pMOS transistor formation region, and a gate electrode 28 and gate insulating film 27 are formed in the nMOS transistor formation region, thereby completing the gate structures 9 and 29.

Figure 5:
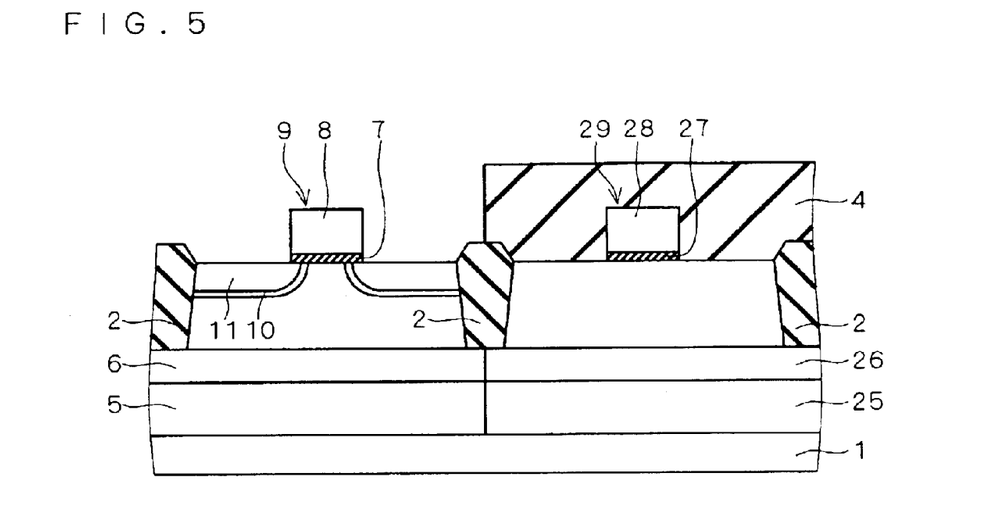

Referring to FIG. 5, a photoresist 4 for opening the pMOS transistor formation region is formed on the semiconductor substrate 1 and element isolation insulating film 2. Then, using the photoresist 4 and gate structure 9 as a mask, an ion implantation of for example boron is performed. The photoresist 4 is then removed. As the result, a p-type extension region 11 that is a p-type impurity region is formed in the upper surface of the semiconductor substrate 1 in the pMOS transistor formation region, specifically in the upper surface of the n-type well region 5.

The acceleration energy and ion implantation concentration employed for forming the p-type extension region 11 will be dependent upon the depth and resistance value of the extension region required for the individual generations of semiconductor devices. In the first preferred embodiment, assuming a semiconductor device of the generation having a wiring width of 0.18 $\mu$m, the acceleration energy is for example 1 to 2 keV, and the concentration is for example $1\times10^{19}$ to $5\times10^{19}/cm^3$. Under these conditions, the p-type extension region 11 is formed so as to have a depth of 60 nm from the upper surface of the semiconductor substrate 1.

With oblique ion implantation method, an n-type impurity layer 10 of which conductivity type is opposite that of the p-type extension region 11 is disposed around the region 11. In the first preferred embodiment, for example, an ion implantation of arsenic is performed at an angle of 20 to 45 degrees with respect to the upper surface of the semiconductor substrate 1, at an acceleration energy of 100 to 130 keV, and at a concentration of $1\times10^{18}/cm^3$.

Figure 6:
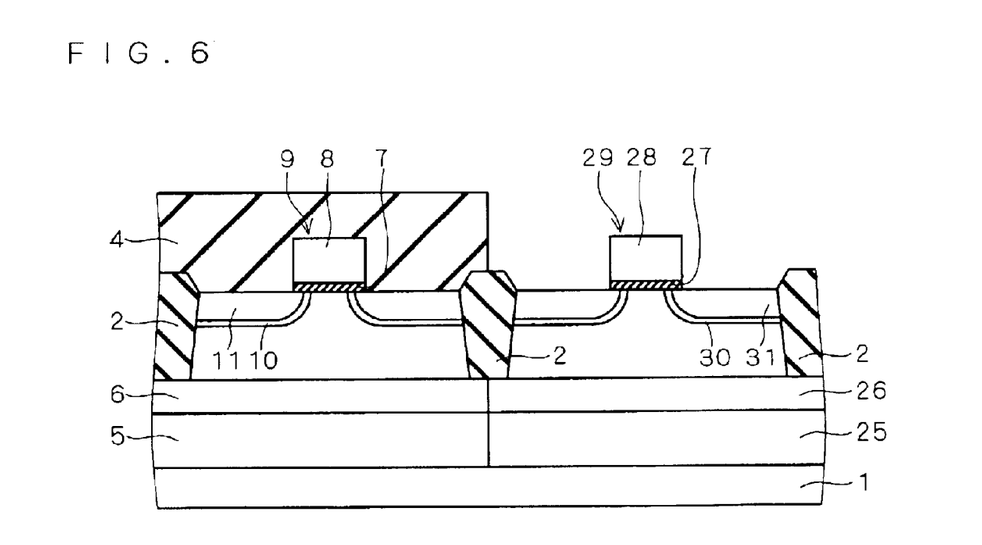
Figure 7:
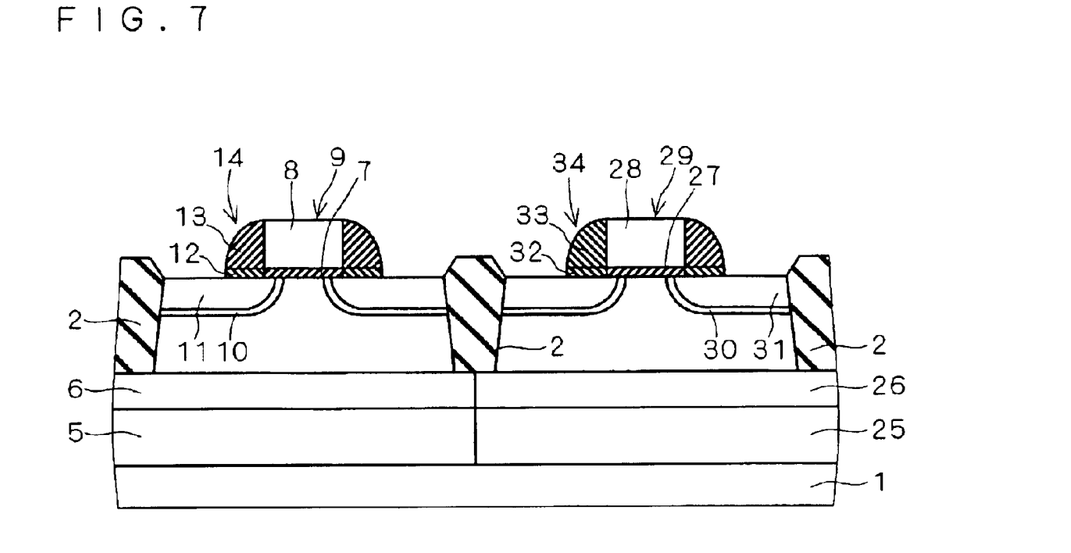

Referring to FIG. 6, a photoresist 4 for opening the nMOS transistor formation region is formed on the semiconductor substrate 1 and element isolation insulating film 2. Then, using the photoresist 4 and gate structure 29 as a mask, an ion implantation of for example arsenic is performed. The photoresist 4 is then removed. As the result, an n-type extension region 31 that is an n-type impurity region is formed in the upper surface of the semiconductor substrate 1 in the nMOS transistor formation region, specifically in the upper surface of the p-type well region 25.

The acceleration energy and ion implantation concentration employed for forming the n-type extension region 31 are for example 3 to 5 keV and $1\times10^{19}$ to $5\times10^{19}/cm^3$, respectively. Under these conditions, the n-type extension region 31 is formed so as to have a depth of 60 nm from the upper surface of the semiconductor substrate 1.

With oblique ion implantation method, a p-type impurity layer 30 of which conductivity type is opposite that of the n-type extension region 31 is disposed around the region 31. In the first preferred embodiment, for example, an ion implantation of boron is performed at an angle of 20 to 45 degrees with respect to the upper surface of the semiconductor substrate 1, at an acceleration energy of 15 to 20 keV, and at a concentration of $1\times10^{18}$ to $5\times10^{18}/cm^3$.

Subsequently, a silicon oxide film having a film thickness of 10 nm and a silicon nitride film having a film thickness of 50 nm are deposited in the order named on the entire surface, and the silicon oxide film and silicon nitride film are etched by anisotropic-dry etching method that exhibits a high etching rate in the direction of the depth of the semiconductor substrate 1. As the result, referring to FIG. 7, a sidewall 14 of two-layer structure composed of a silicon oxide film 12 and silicon nitride film 13 is formed on the side surface of the gate structure 9 and on part of the p-type extension region 11. At the same time, a sidewall 34 of two-layer structure composed of a silicon oxide film 32 and silicon nitride film 33 is formed on the side surface of the gate structure 29 and on part of the n-type extension region 31.

Figure 8:
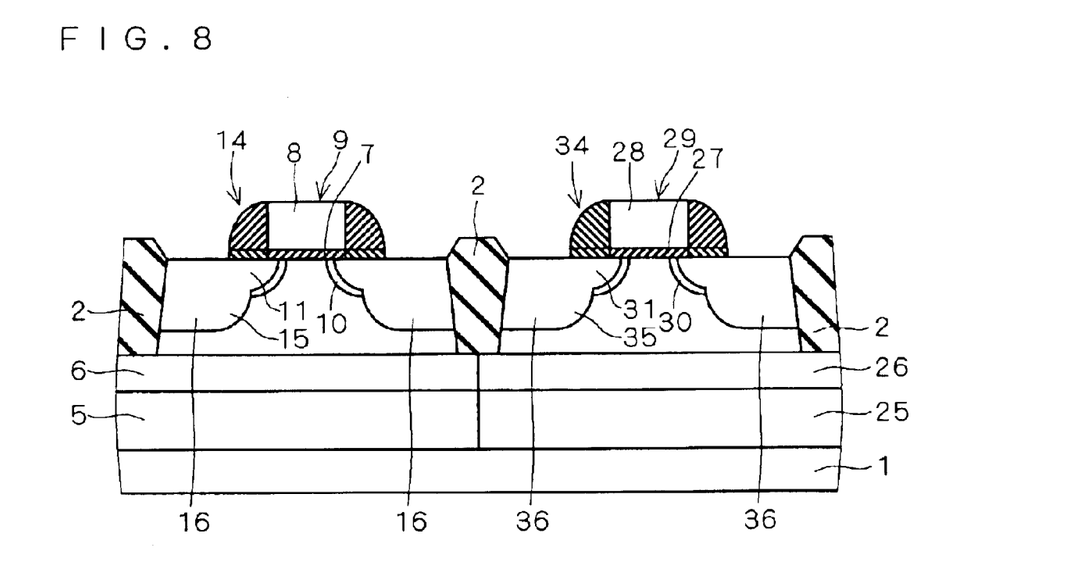

Referring to FIG. 8, a p-type impurity region 15 and n-type impurity region 35 are formed in the upper surfaces of the n-type well region 5 and p-type well region 25, respectively. Specifically, a photoresist (not shown) for opening the pMOS transistor formation region is firstly formed on the semiconductor substrate 1 and element isolation insulating film 2. Using, as a mask, this photoresist, gate structure 9 and sidewall 14, an ion implantation of boron is performed at an acceleration energy of 3 to 5 keV and at a concentration of $2\times10^{20}$ to $6\times10^{20}/cm^3$. The photoresist is then removed. As the result, the p-type impurity region 15 having higher impurity concentration than the p-type extension region 11 is formed in the upper surface of the n-type well region 5.

Subsequently, a photoresist (not shown) for opening the nMOS transistor formation region is formed on the semiconductor substrate 1 and element isolation insulating film 2. Using, as a mask, this photoresist, gate structure 29 and sidewall 34, an ion implantation of arsenic is performed at an acceleration energy of 40 to 60 keV and at a concentration of $2\times10^{20}$ to $6\times10^{20}/cm^3$. As the result, the n-type impurity region 35 having higher impurity concentration than the n-type extension region 31 is formed in the upper surface of the p-type well region 25.

Through the foregoing steps, a plurality of source/drain regions 16 that are each composed of the p-type extension region 11 and p-type impurity region 15 are formed at predetermined intervals from each other in the upper surface of the semiconductor substrate 1 in the pMOS transistor formation region, specifically in the upper surface of the n-type well region 5. The gate structure 9 is formed on the upper surface of the semiconductor substrate 1 between the adjacent source/drain regions 16. In other words, the gate structure 9 is formed on the upper surface of the semiconductor substrate 1 that is adjacent to each of the adjacent source/drain regions 16.

Likewise, a plurality of source/drain regions 36 that are each composed of the n-type extension region 31 and n-type impurity region 35 are formed at predetermined intervals from each other in the upper surface of the p-type well region 25. The gate structure 29 is formed on the upper surface of the semiconductor substrate 1 between the adjacent source/drain regions 36.

Figure 9:
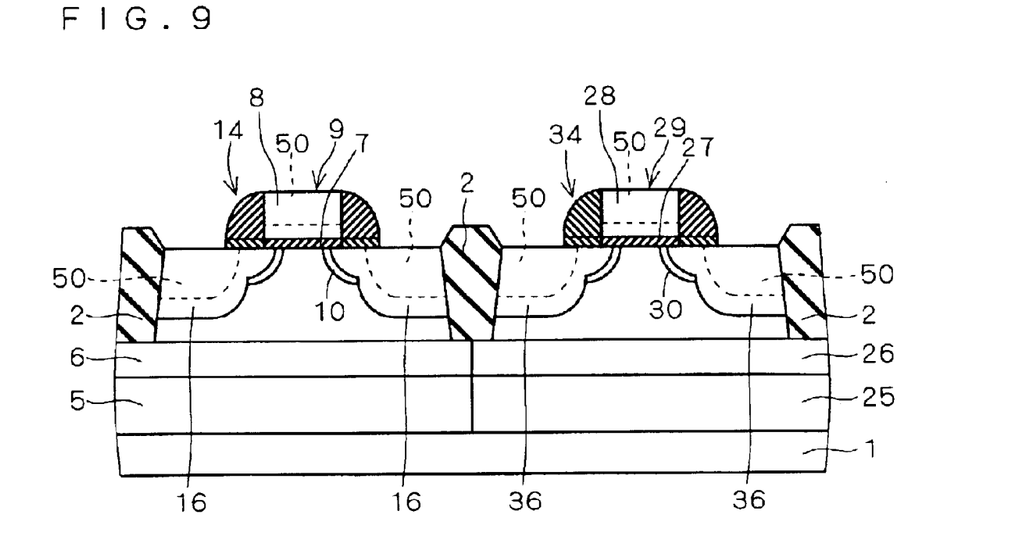

Referring to FIG. 9, impurity that suppresses silicide formation reaction (hereinafter referred to as a "suppression impurity"), such as germanium, is implanted from above the semiconductor substrate 1 at an acceleration energy of 120 keV and at a concentration of $5\times10^{19}/cm^3$. As the result, the suppression impurity is introduced into the source/drain regions 16, 36, and the gate electrodes 8, 28 from their upper surfaces. In FIG. 9, a region where the suppression impurity is distributed in the source/drain regions 16, 36, and the gate electrodes 8, 28 (hereinafter referred to simply as a "distribution region") 50 is indicated by the broken line. Compared to silicon, germanium has higher reaction energy with cobalt or titanium and is generally known as a material suppressing silicide formation reaction.

Figure 10:
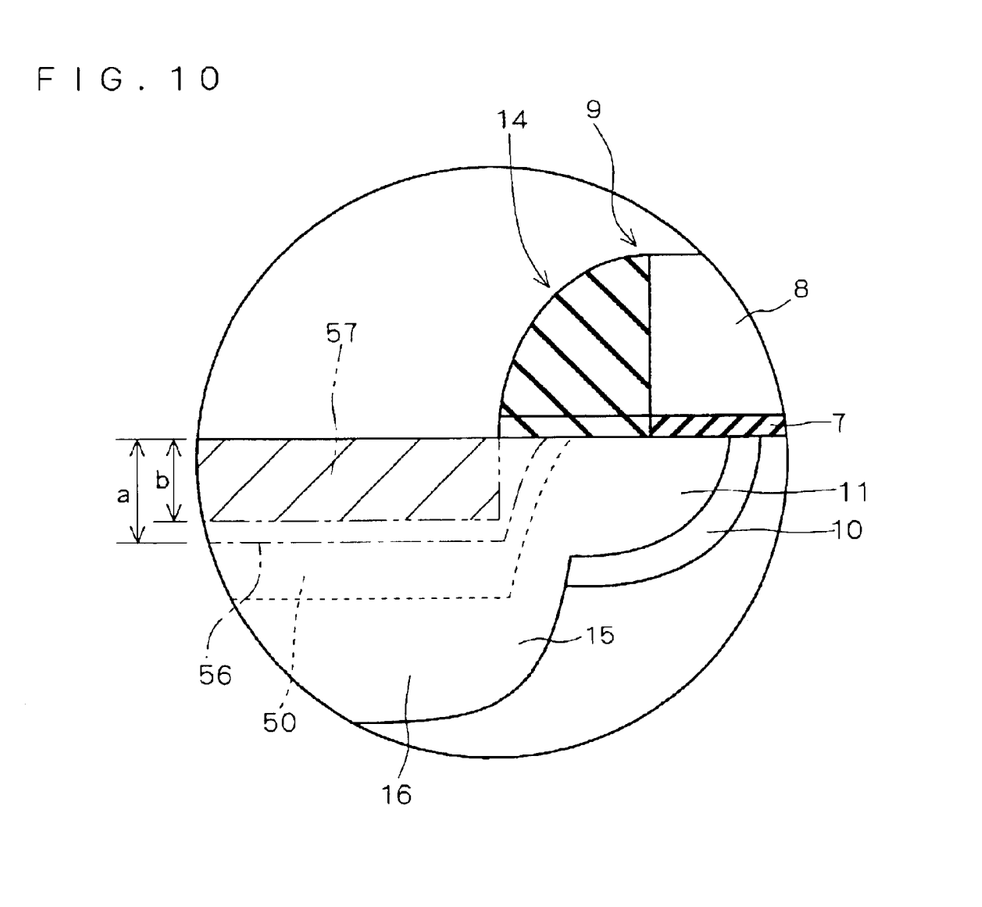
FIG. 10 is a sectional view showing the structure of the semiconductor device of the first preferred embodiment.
Figure 11A:
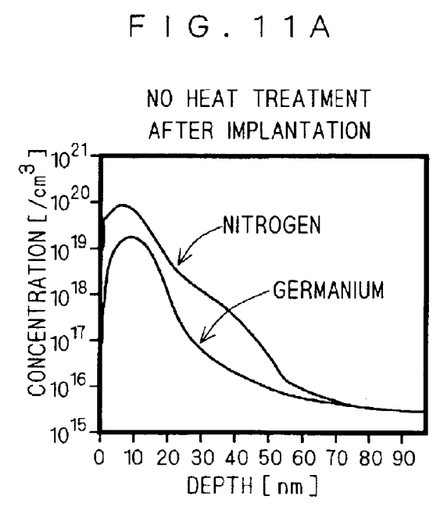
FIGS. 11(A) and 11(B) are diagrams showing a concentration distribution of germanium in a semiconductor substrate.
Figure 11B:
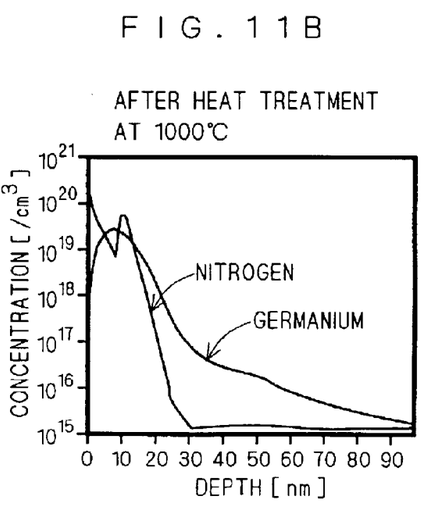

FIG. 10 is a partially enlarged view of FIG. 9, showing in enlarged dimension the source/drain region 16 and its neighborhood in the pMOS transistor formation region. FIGS. 11(A) and 11(B) are diagrams showing a concentration distribution when germanium is introduced into the semiconductor substrate 1 from its upper surface at an acceleration energy of 20 keV and at a concentration of $5\times10^{19}/cm^3$.

In these drawings, a nitrogen concentration distribution is also shown for comparison. That is, FIG. 11(A) shows the concentration distribution before heat treatment, and FIG. 11(B) shows the concentration distribution after heat treatment at 1000° C. by RTA (rapid thermal anneal). In these drawings, the abscissa represents the depth from the upper surface of the semiconductor substrate 1. In FIG. 10, a dash-single line 56 indicates the position of a concentration peak of the suppression impurity in the distribution region 50, and region 57 indicated by slant lines shows a region that is made into silicide in the next following step.

Referring to FIG. 10, in the first preferred embodiment, the concentration peak of the suppression impurity is set to a location deeper than the region 57 to be made into silicide in the next following step. In other words, distance a from the upper surface of the semiconductor substrate 1 to the concentration peak of the suppression impurity below the exposed surface of the source/drain region is set to a value larger than depth b from the upper surface of the semiconductor substrate 1 in the region 57 to be made into silicide in the next following step. It is noted that the distribution of the suppression impurity in the source/drain region reflects the shape of the upper surface of the structure shown in FIG. 9.

In the first preferred embodiment, as will be described later, the depth b of the region 57 to be made into silicide is set to 50 nm, and the acceleration energy is adjusted such that the concentration peak of the suppression impurity is set to a location deeper than the depth b. As shown in FIG. 11, when germanium is introduced at the acceleration energy of 20 keV, the concentration peak of germanium is located at a depth of 10 nm. Therefore, as in the first preferred embodiment, the concentration peak depth can be set to 60 nm by implanting germanium at the acceleration energy of 120 keV.

Thus in the first preferred embodiment, the concentration peak of the suppression impurity is set to a location deeper than the region to be made into silicide in the next following step. In consideration of the variations of the depth b of the region 57 to be made into silicide and the variations of the concentration distribution of the suppression impurity, the first preferred embodiment employs such an acceleration energy value that the concentration peak depth of the suppression impurity is 60 nm. Germanium is easy to diffuse in the semiconductor substrate if its impurity concentration is high, whereas the effect of suppressing silicide formation reaction is reduced if it is low. Therefore, as in the first preferred embodiment, the ion implantation concentration of germanium is preferably set to about 10% of the ion implantation concentration when forming the p-type impurity region 15 or n-type impurity region 35 in the source/drain region.

Subsequently, the impurity in the source/drain regions 16 and 36 is rearranged by performing a high temperature anneal for example at 1000° C. As the result, the depth of the source/drain regions 16 and 36 from the upper surface of the semiconductor substrate 1 is 0.9 to 1.3 μm. As shown in FIG. 11(B), unlike nitrogen, germanium is hard to diffuse at that time in the semiconductor substrate 1, so that its concentration distribution is hardly changed.

Figure 12:
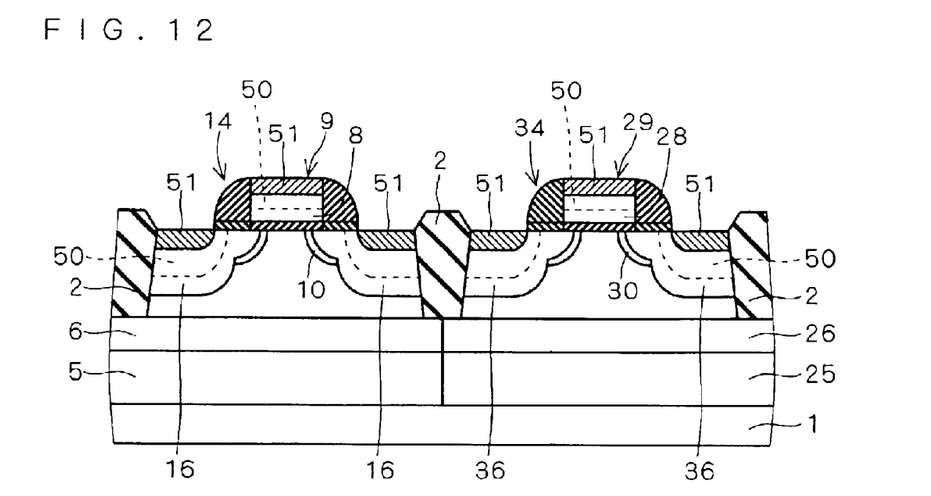
FIGS. 12 and 13 are sectional views showing, in the order of the steps, the method of manufacturing a semiconductor device in the first preferred embodiment.

Referring to FIG. 12, a region shallower than the lower limit of the distribution region 50 in the source/drain regions 16, 36 and the gate electrodes 8, 28, is made into silicide from their upper surfaces, so that a silicide film 51 is formed in the source/drain regions 16, 36 and gate electrodes 8, 28. Specifically, a cobalt film having a film thickness of for example 10 nm is deposited on the entire surface by sputtering method. Thereafter, anneal at 500° C. is performed to react cobalt with silicon making contact with cobalt. As the result, in the source/drain regions 16, 36 and gate electrodes 8, 28, the region that has a depth of 50 nm from their upper surfaces is made into silicide.

Thus, the region shallower than the lower limit of the distribution region 50 is made into silicide, and the silicide film 51 that is composed of cobalt silicide and has a film thickness of 50 nm is formed on the upper surfaces of the source/drain regions 16, 36 and gate electrodes 8, 28. The unreacted cobalt film is then removed.

Since the silicide film 51 in this state is composed of cobalt monosilicide such as CoSi and $Co_2Si$, anneal at 700° C. or higher is performed again in order to subject the cobalt monosilicide to a phase transition for obtaining $CoSi_2$. As the result, the silicide film 51 has a low resistance.

Figure 13:
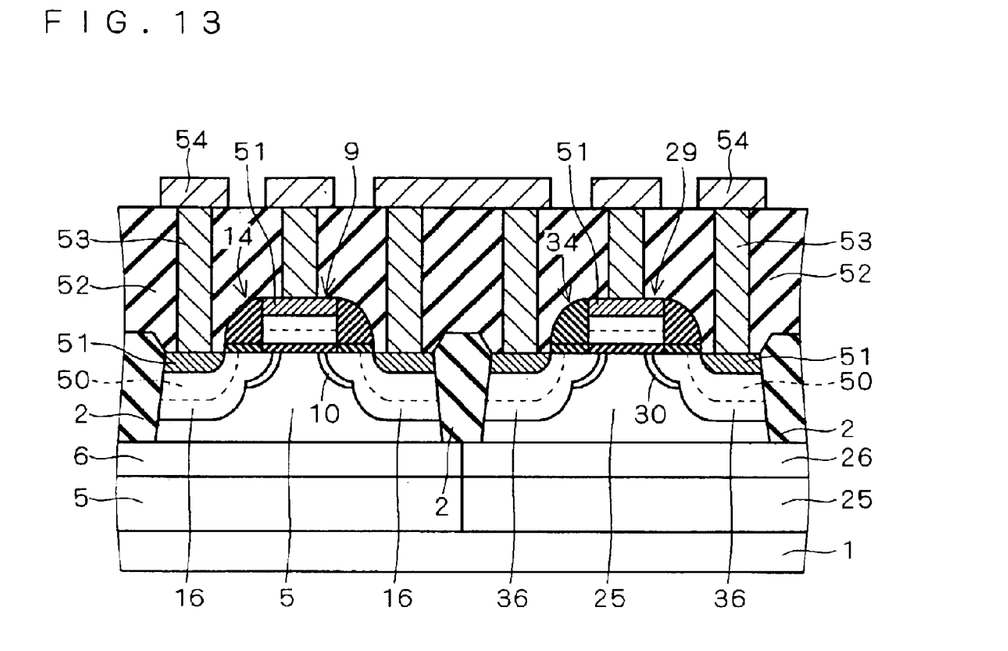

Referring to FIG. 13, an interlayer insulating film 52 is formed on the semiconductor substrate 1 so as to cover the gate structures 9, 29, sidewalls 14, 34, and element isolation insulating film 2. For example, a TEOS oxide film is used as the interlayer insulating film 52. Thereafter, contact holes (not shown) reaching the silicide film 51 located in the source/drain regions 16, 36, and gate electrodes 8, 28 are opened to the interlayer insulating film 52, and contact plugs 53 are formed to fill the contact holes.

Subsequently, wirings 54 electrically connected to the contact plugs 53 are formed on the interlayer insulating film 52, thereby completing the semiconductor device. For example, the contact plugs 53 are composed of tungsten, and the wirings 54 are composed of aluminum.

Thus, in the method of manufacturing a semiconductor device according to the first preferred embodiment, the suppression impurity is introduced into the source/drain regions 16 and 36, and the region shallower than the distribution region 50 of the suppression impurity is made into silicide in the succeeding step. Accordingly, the suppression impurity is present below the region 57 to be made into silicide. Therefore, when cobalt monosilicide is subjected to the phase transition for obtaining $CoSi_2$ that has a lower resistance, it is possible to suppress that silicide formation reaction extends to the underside of the region 57 to be made into silicide, and that silicide locally grows up to the vicinity of the junction between the source/drain region and well region. This enables to reduce the junction leakage between the source/drain region and well region, thus improving the yield of the semiconductor device.

Further, the depth of source/drain region has conventionally been set to a large value, assuming that silicide grows greatly in the direction of the depth. On the other hand, there is no need to do so in the first preferred embodiment, and the source/drain region can be formed shallowly to attain the miniaturization of the semiconductor device.

Since, in the first preferred embodiment, the concentration peak of the suppression impurity is set to a location deeper than the region 57 to be made into silicide, the concentration of the suppression impurity in the region 57 can be set to a low value. It is therefore possible to relax the suppression of silicide formation reaction in the region 57. This enables to form a silicide film having a desired film thickness in the source/drain region.

As shown in FIG. 11, germanium is unsusceptible to thermal diffusion and the impurity distribution can be controlled only by implantation condition. Therefore, as in the first preferred embodiment, the use of germanium as a suppression impurity makes it easy to obtain a desired concentration distribution of the suppression impurity.

Although the first preferred embodiment employs the cobalt film for making the source/drain regions and gate electrodes into silicide, a titanium film may be used therefor. That is, titanium silicide may be formed in the source/drain regions and gate electrodes.

In the first preferred embodiment, the well region is provided because the p-channel MOS transistor and n-channel MOS transistor are formed on the same substrate. However, if only an n-channel MOS transistor is formed on a single substrate, an n-type source/drain region may be formed, without forming any well region, in a p-type semiconductor substrate, the entire region of which becomes a p-type impurity region by the introduction of a p-type impurity.

In an alternative, an SOI substrate may be employed in place of the semiconductor substrate 1. A method of manufacturing a semiconductor device in this alternative will be described as a modification of the first preferred embodiment. Detailed manufacturing conditions such as the acceleration energy and implantation concentration of impurity are the same as described above, and therefore, its description is omitted here.

Figure 14:
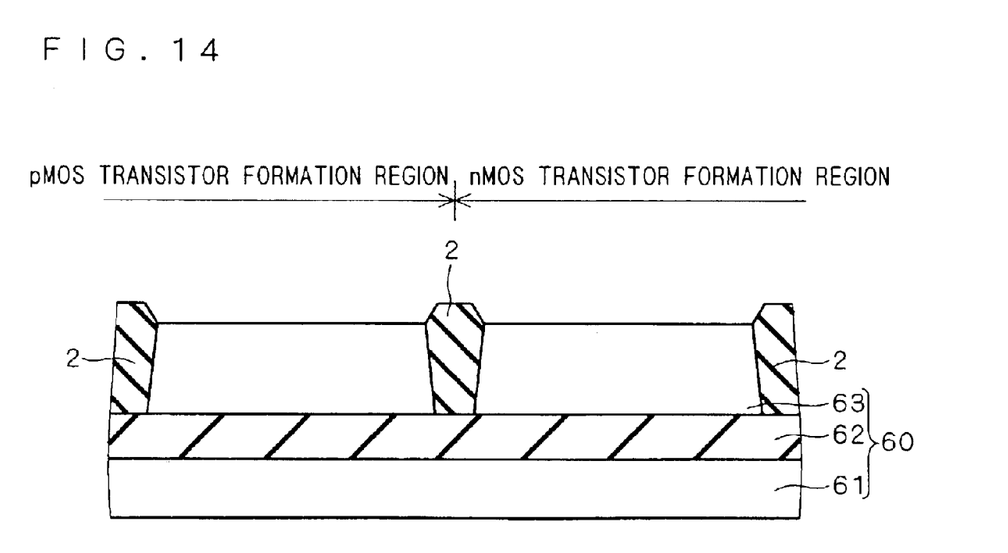
FIGS. 14 to 17 are sectional views showing, in the order of the steps, a modification of the method of manufacturing a semiconductor device in the first preferred embodiment.

FIGS. 14 to 17 are sectional views showing, in the order of the steps, the modification of the method of manufacturing a semiconductor device in the first preferred embodiment. Referring to FIG. 14, there is firstly prepared an SOI substrate 60 in which a support substrate 61 that is for example a p-type silicon substrate, an insulating layer 62 called "box oxide film", and a semiconductor layer 63 that is for example a p-type silicon layer are laminated in the order named, and then an element isolation insulting film 2 is formed in an upper surface of the semiconductor layer 63. The element isolation insulating film 2 divides the semiconductor layer 63 into a pMOS transistor formation region and an nMOS transistor formation region.

Figure 15:
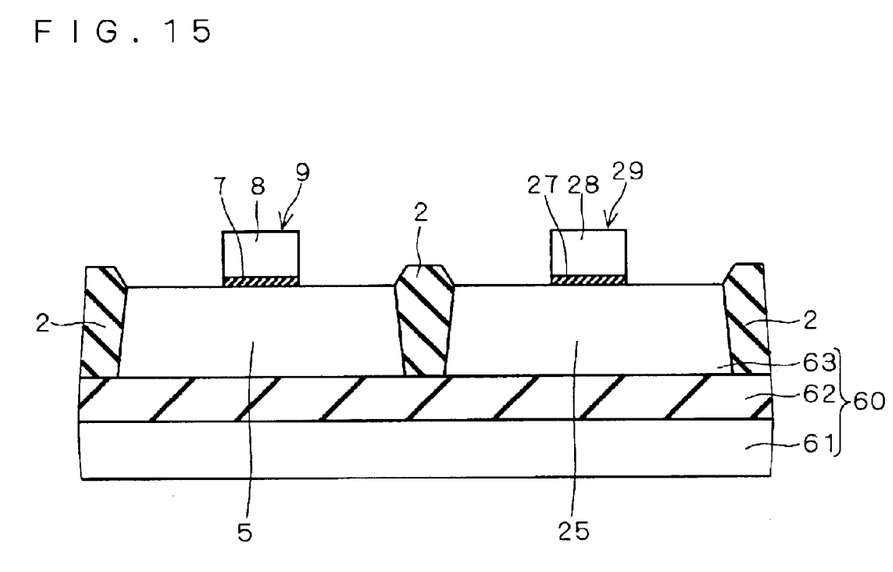

Referring to FIG. 15, an n-type well region 5 is formed in the upper surface of the semiconductor layer 63 in the pMOS transistor formation region, and a p-type well region 25 is formed in the upper surface of the semiconductor layer 63 in the nMOS transistor formation region. Subsequently, gate structures 9 and 29 are formed on the semiconductor layer 63 in the pMOS transistor formation region and nMOS transistor formation region, respectively.

Figure 16:
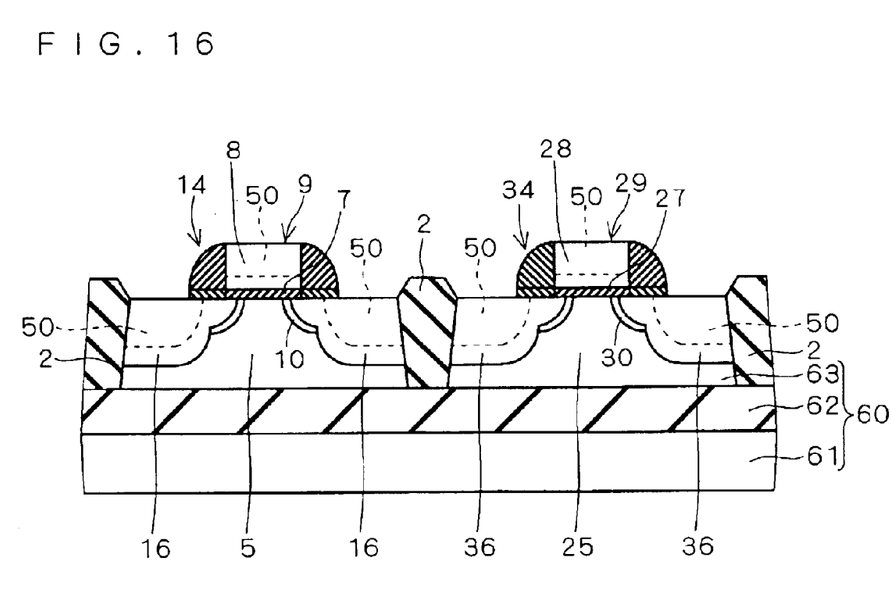

Referring to FIG. 16, a p-type extension region 11 is formed in an upper surface of the n-type well region 5, and an n-type impurity layer 10 of which conductivity type is opposite that of the p-type extension region 11 is disposed around the region 11. Then, an n-type extension region 31 is formed in the upper surface of the p-type well region 25, and a p-type impurity layer 30 of which conductivity type is opposite that of the n-type extension region 31 is disposed around the region 31.

Subsequently, a sidewall 14 is formed on the side surface of the gate structure 9 and on part of the p-type extension region 11, and a sidewall 34 is formed on the side surface of the gate structure 29 and on part of the n-type extension region 31. Thereafter, a p-type impurity region 15 and n-type impurity region 35 are formed in the upper surfaces of the n-type well region 5 and p-type well region 25, respectively. As the result, source/drain regions 16 and 36 are formed in the upper surfaces of the n-type well region 5 and p-type well region 25, respectively.

Subsequently, for example, germanium is implanted from above the SOI substrate 60, so that germanium is introduced into the source/drain regions 16, 36, and gate electrodes 8, 28. Then, a high-temperature anneal at for example 1000° C. is performed to rearrange the impurity in the source/drain regions 16 and 36.

Figure 17:
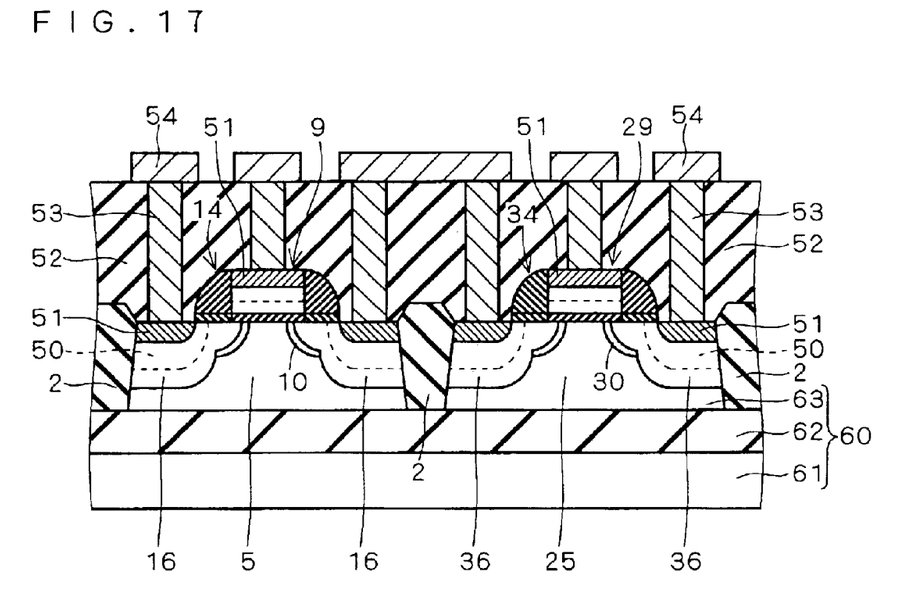

Referring to FIG. 17, a region shallower than a distribution region 50 in the source/drain regions 16, 36 and gate electrodes 8, 28, is made into silicide from their surfaces, so that a silicide film 51 is formed in the source/drain regions 16, 36, and gate electrodes 8, 28. Thereafter, anneal at 700° C. or higher is performed to lower the resistance of the silicide film 51.

Subsequently, an interlayer insulating film 52 is formed on the semiconductor layer 63 so as to cover the gate structures 9, 29, sidewalls 14, 34, and element isolation insulating film 2. Then, contact plugs 53 and wirings 54 are formed successively to complete the semiconductor device.

Thus, even in the case of forming the MOS transistors on the SOI substrate 60, the above-mentioned effect is obtainable.

Second Preferred Embodiment

As previously described, when the source/drain region is made into silicide in the state that the semiconductor layer of the SOI substrate is thinned for miniaturizing the semiconductor device, there has been the problem that silicide grows greatly in the direction of the channel region underlying the gate electrode. To solve this problem, a second preferred embodiment of the present invention presents a manufacturing method that can prevent silicide formation reaction from extending to the channel region.

FIGS. 18 to 24 are sectional views showing, in the order of the steps, a method of manufacturing a semiconductor device according to the second preferred embodiment. This preferred embodiment is directed to a manufacturing method when a semiconductor layer and silicide film are formed at the same thickness.

Figure 18:
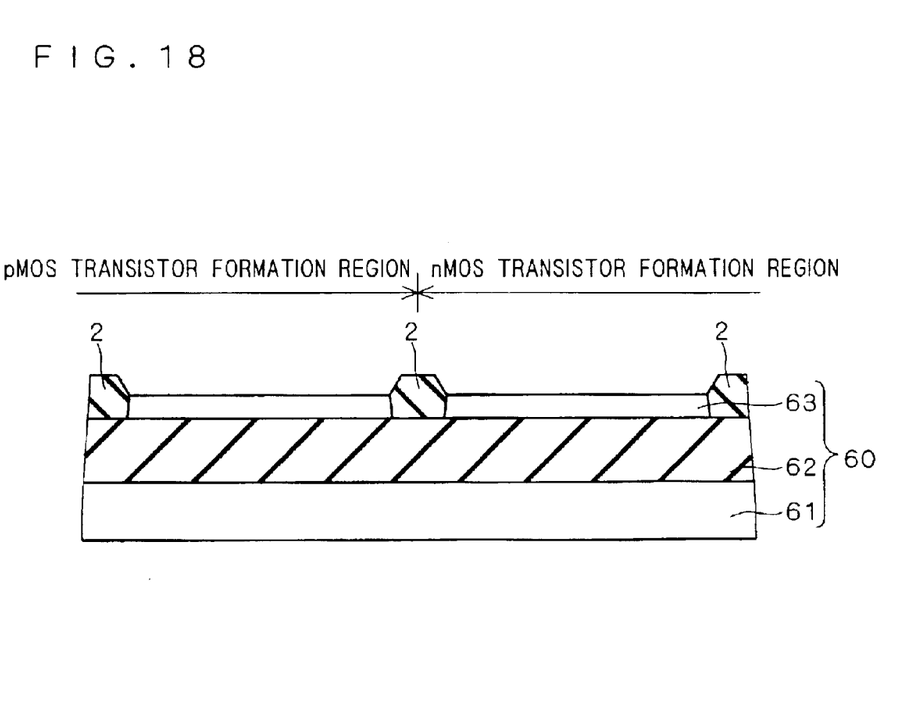
FIGS. 18 to 24 are sectional views showing, in the order of the steps, a method of manufacturing a semiconductor device according to a second preferred embodiment of the present invention.

Referring to FIG. 18, an SOI substrate 60 in which a support substrate 61, an insulating film 62, and a semiconductor layer 63 are laminated in the order named is prepared, and then an element isolation insulating film 2 is formed in an upper surface of the semiconductor layer 63.

For example, the thickness of the insulating layer 62 is 100 to 400 nm, and the thickness of the semiconductor layer 63 is 50 nm. The element isolation insulating film 2 divides the semiconductor layer 63 into a pMOS transistor formation region and an nMOS transistor formation region.

Figure 19:
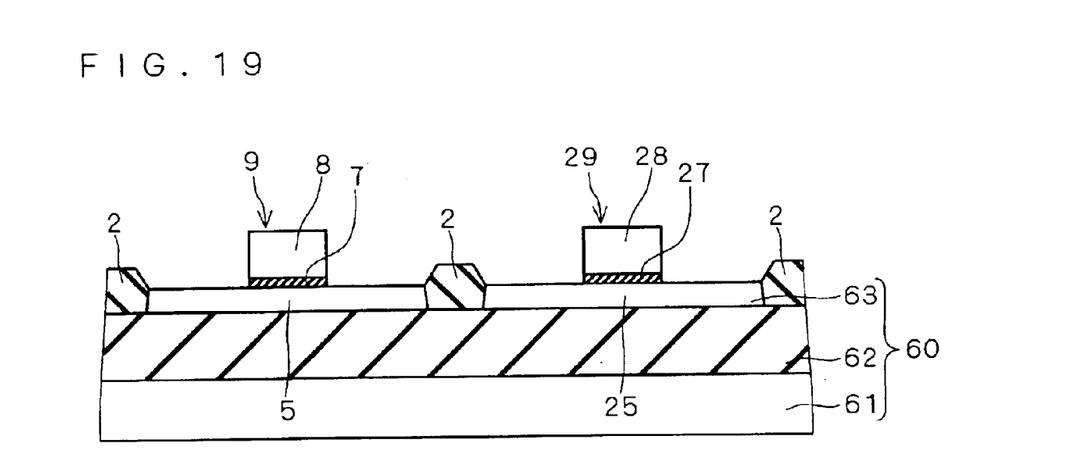

Referring to FIG. 19, in the same manner as in the first preferred embodiment, an n-type well region 5 is formed in an upper surface of the semiconductor layer 63 in the pMOS transistor formation region, and a p-type well region 25 is formed in the upper surface of the semiconductor layer 63 in the nMOS transistor formation region. Thereafter, gate electrodes 9 and 29 are formed on the semiconductor layer 63 in the pMOS transistor formation region and nMOS transistor formation region, respectively.

Figure 20:
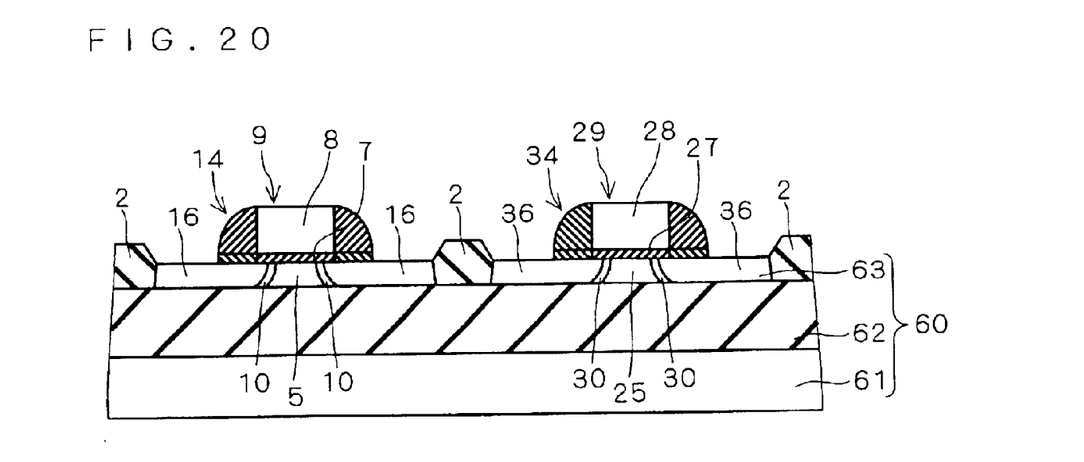

Referring to FIG. 20, in the same manner as in the first preferred embodiment, a p-type extension region 11 is formed in an upper surface of the n-type well region 5, and an n-type impurity layer 10 of which conductivity type is opposite that of the p-type extension region 11 is disposed around the region 11. Then, an n-type extension region 31 is formed in the upper surface of the p-type well region 25, and a p-type impurity layer 30 of which conductivity type is opposite that of the n-type extension region 31 is disposed around the region 31.

Subsequently, a sidewall 14 is formed on the side surface of the gate structure 9 and on part of the p-type extension region 11, and a sidewall 34 is formed on the side surface of the gate structure 29 and on part of the n-type extension region 31. Thereafter, a p-type impurity region 15 and n-type impurity region 35 are formed in the upper surfaces of the n-type well region 5 and p-type well region 25, respectively. As the result, source/drain regions 16 and 36 are formed in the upper surfaces of the n-type well region 5 and p-type well region 25, respectively.

Figure 21:
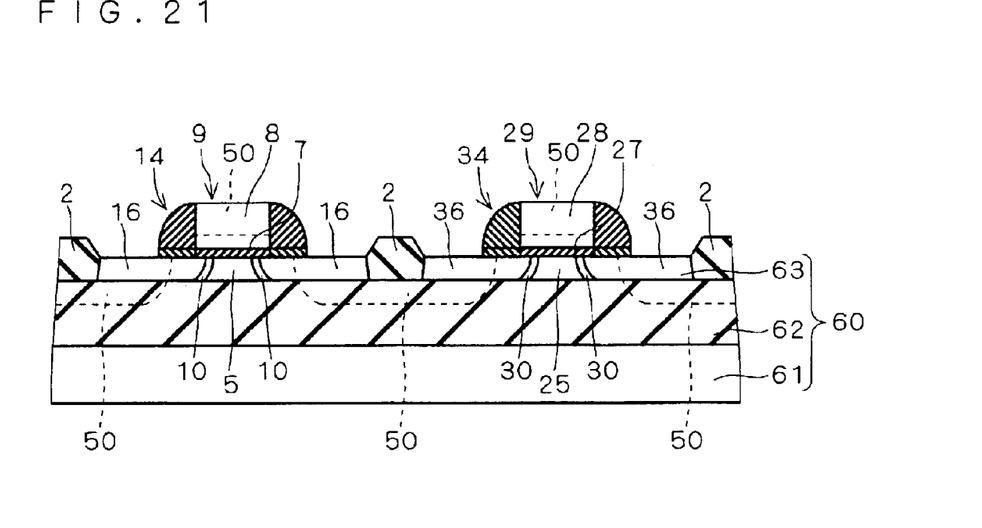

Referring to FIG. 21, a suppression impurity such as germanium is implanted from above the SOI substrate 60 at an acceleration energy of 120 keV and a concentration of $5 \times 10^{19}/cm^3$. As the result, the suppression impurity is introduced into the source/drain regions 16, 36, and gate electrodes 8, 28 from their upper surfaces.

Figure 22:
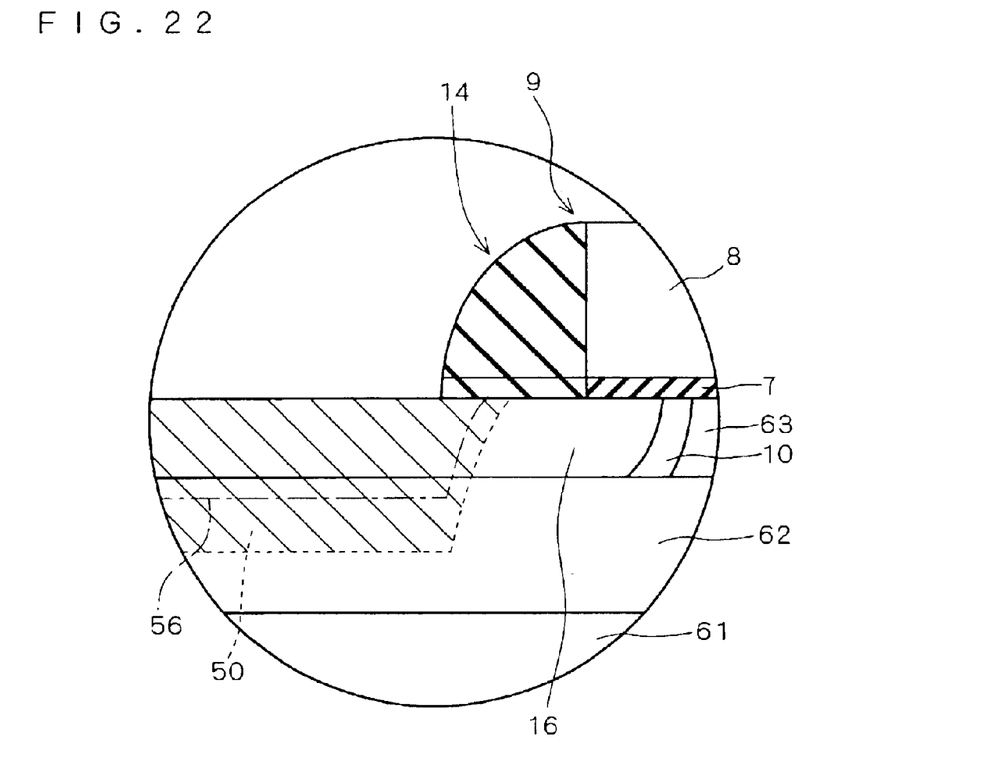

FIG. 22 is a partially enlarged view of FIG. 21, showing the source/drain region 16 an its surrounding in the pMOS transistor formation region. In FIG. 22, a distribution region 50 of suppression impurity is represented by the line that moves diagonally down to the right.

As shown in the distribution region 50, the suppression impurity is introduced into not only the semiconductor layer 63 but also the insulating layer 62. Further, the suppression impurity is also introduced into not only below the exposed upper surface of the source/drain regions 16 and 36, but also below the sidewalls 14 and 34.

In the second preferred embodiment, as shown by the dash-single line 56 indicating the location of the concentration peak of the suppression impurity, the concentration peak location of the suppression impurity is set within the insulating layer 62 at the underside of the exposed surface of the source/drain region, and it is set within the source/drain region and within the insulating layer 62 at the underside of the sidewall. That is, the concentration peak of the suppression impurity in the source/drain region is set to the underside of the sidewall.

Subsequently, a high-temperature anneal at for example 1000° C. is performed to rearrange the impurity in the source/drain regions 16 and 36.

Figure 23:
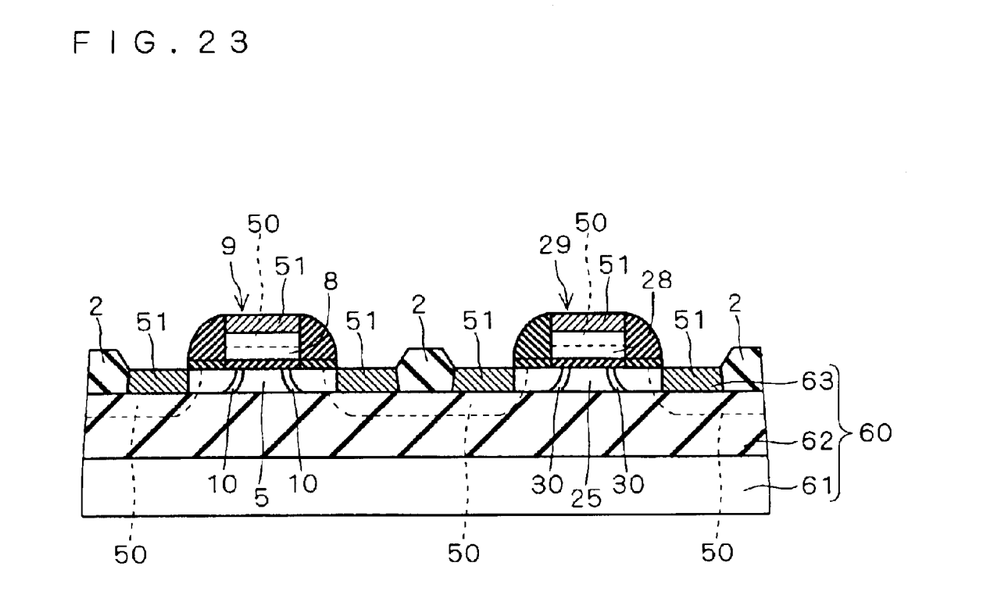

Referring to FIG. 23, the source/drain regions 16, 36 and gate electrodes 8, 28 are made into silicide from their upper surfaces, so that a silicide film 51 is formed in the source/drain regions 16, 36 and gate electrodes 8, 28. Specifically, a cobalt film having a film thickness of for example 10 nm is deposited on the entire surface by sputtering method. Thereafter, anneal at 500° C. is performed to react cobalt with silicon making contact with cobalt. As the result, in the source/drain regions 16, 36 and gate electrodes 8, 28, the region that has a depth of 50 nm from their upper surfaces is made into silicide. In the second preferred embodiment, the thickness of the semiconductor layer 63 is set to 50 nm, and therefore, the entire region is made into silicide below the exposed surfaces of the source/drain regions 16 and 36. The unreacted cobalt film is then removed.

Since the silicide film 51 in this state is composed of cobalt monosilicide such as CoSi and $Co_2Si$, anneal at 700° C. or higher is performed again in order to subject the cobalt monosilicide to a phase transition for obtaining $CoSi_2$. As the result, the silicide film 51 has a low resistance.

Figure 24:
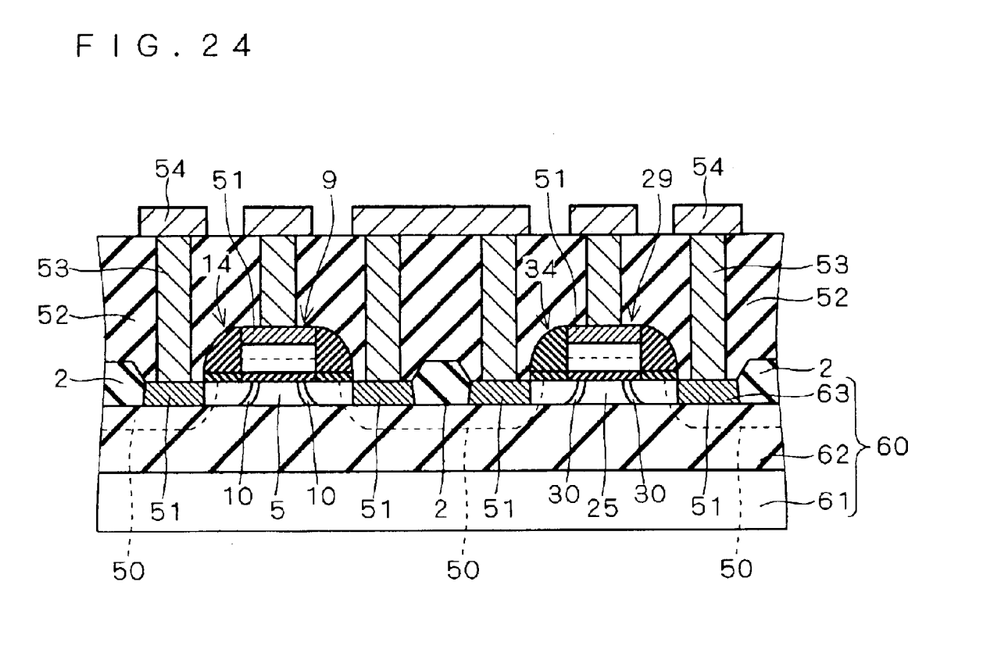

Referring to FIG. 24, an interlayer insulating film 52 is formed on the semiconductor layer 63 so as to cover the gate structures 9, 29, sidewalls 14, 34, and element isolation insulating film 2. Thereafter, contact holes (not shown) reaching the silicide film 51 located in the source/drain regions 16, 36, and gate electrodes 8, 28 are opened to the interlayer insulating film 52, and contact plugs 53 are formed to fill the contact holes.

Subsequently, wirings 54 electrically connected to the contact plugs 53 are formed on the interlayer insulating film 52, thereby completing the semiconductor device.

Thus, in the method of manufacturing a semiconductor device according to the second preferred embodiment, the suppression impurity is also introduced into the source/drain regions below the sidewalls. Therefore, even if the semiconductor layer of the SOI substrate is thinned by miniaturization, it is possible to suppress that silicide formation reaction extends to the channel region below the gate structure when the exposed surface of the source/drain region is made into silicide. This enables to reduce the leakage current between the source and drain. It is also possible to prevent the effective channel length from being shortened, thus permitting a still further miniaturization of the semiconductor device.

Furthermore, in the second preferred embodiment, the concentration peak of the suppression impurity is set to a location lower than the source/drain region with respect to the underside of the exposed surface of the source/drain region, and it is set to within the source/drain region with respect to the underside of the sidewall. It is therefore possible to lower the suppression impurity concentration in the region below the exposed upper surface of the source/drain region. This enables to relax the suppression of silicide formation reaction in the region underlying the exposed surface of the source/drain region. As the result, a silicide film having a desired film thickness can be formed in the source/drain region, while suppressing the extension of silicide formation reaction to the channel region.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:

(a) preparing a semiconductor substrate having in its upper surface a first impurity region of a first conductivity type and a second impurity region of a second conductivity type, said second impurity region being formed in an upper surface of said first impurity region;

(b) introducing impurity suppressing silicide formation into said second impurity region from its upper surface;

(c) after said introducing step, rearranging an impurity in said second impurity region by annealing; and (d) making into silicide, after said step (c), a region in said second impurity region from its upper surface, said region being shallower than a lower limit of a region where said impurity introduced in said step (b) is distributed.

2. A method of manufacturing a semiconductor device according to claim 1, wherein in said step (b), a concentration peak of said impurity is set to a location deeper than said region to be made into silicide in said step (d).

3. A method of manufacturing a semiconductor device according to claim 1, wherein in said step (a) said semiconductor substrate further has on its upper surface a gate structure, said second impurity region serving as a source/drain region.

4. A method of manufacturing a semiconductor device according to claim 2, wherein in said step (a) said semiconductor substrate further has on its upper surface a gate structure, said second impurity region serving as a source/drain region.

5. A method of manufacturing a semiconductor device according to claim 1 wherein said impurity is germanium.

6. A method of manufacturing a semiconductor device according to claim 2 wherein said impurity is germanium.

7. A method of manufacturing a semiconductor device according to claim 3 wherein said impurity is germanium.

8. A method of manufacturing a semiconductor device according to claim 4 wherein said impurity is germanium.

9. A method of manufacturing a semiconductor device comprising the steps of:

(a) preparing an SOI substrate having an insulating film and a semiconductor layer formed on said insulating film;

(b) forming a source/drain region in an upper surface of said semiconductor layer and forming a gate structure having on its side surface a sidewall on said upper surface of said semiconductor layer adjacent to said source/drain region;

(c) introducing impurity suppressing suicide formation into said source/drain region from above said SOI substrate;

(d) after said introducing step, rearranging an impurity in said source/drain region by annealing; and (e) making into silicide, after said step (d), said source/drain region from its upper surface, wherein said sidewall is also disposed partially on said source/drain region, and in said step (c), said impurity is introduced not only below an exposed upper surface of said source/drain region but also below said sidewall.

10. A method of manufacturing a semiconductor device according to claim 9 wherein said impurity is germanium.

11. A method of manufacturing a semiconductor device according to claim 1, wherein said introducing step is performed so that an ion implantation concentration of said impurity is about 10% of an ion implantation concentration used for preparing said second impurity region.

12. A method of manufacturing a semiconductor device according to claim 9, wherein said introducing step is performed so that an ion implantation concentration of said impurity is about 10% of an ion implantation concentration used in said step of forming said source/drain region.

13. A method of manufacturing a semiconductor device comprising the steps of:

(a) preparing an SOI substrate having an insulating film and a semiconductor layer formed on said insulating film;

(b) forming a source/drain region in an upper surface of said semiconductor layer and forming a gate structure having on its side surface a sidewall on said upper surface of said semiconductor layer adjacent to said source/drain region;

(c) introducing impurity suppressing silicide formation into said source/drain region from above said SOI substrate, wherein a concentration peak of said impurity is set to a location lower than said source/drain region with respect to the underside of said exposed upper surface of said source/drain region and is set to be within said source/drain region with respect to the underside of said sidewall; and (d) making into silicide, after said step (c), said source/drain region from its upper surface, wherein said sidewall is also disposed partially on said source/drain region, and in said step (c), said impurity is introduced not only below an exposed upper surface of said source/drain region but also below said sidewall.

14. A method of manufacturing a semiconductor device according to claim 13, wherein said impurity is germanium.

* * * * *